United States Patent
Crane et al.

(10) Patent No.: US 11,128,278 B2
(45) Date of Patent: Sep. 21, 2021

(54) SYSTEMS AND METHODS FOR BALANCING UNBALANCED POWER CABLES

(71) Applicant: Extract Management Company, LLC, Tulsa, OK (US)

(72) Inventors: Mitchell Lee Crane, Tulsa, OK (US); Stark Kremeier, Tulsa, OK (US); Robert McCoy, Tulsa, OK (US)

(73) Assignee: Extract Management Co., LLC, Tulsa, OK (US)

( * ) Notice: Subject to any disclaimer, the term of this patent is extended or adjusted under 35 U.S.C. 154(b) by 0 days.

(21) Appl. No.: 17/096,414

(22) Filed: Nov. 12, 2020

(65) Prior Publication Data
US 2021/0143788 A1 May 13, 2021

Related U.S. Application Data

(60) Provisional application No. 62/934,734, filed on Nov. 13, 2019.

(51) Int. Cl.
*H03H 7/42* (2006.01)
*H01B 7/08* (2006.01)
*E21B 17/00* (2006.01)
*E21B 43/12* (2006.01)

(52) U.S. Cl.
CPC ............. *H03H 7/42* (2013.01); *E21B 17/003* (2013.01); *E21B 43/128* (2013.01); *H01B 7/08* (2013.01)

(58) Field of Classification Search
CPC . H03H 7/42; E21B 17/003; H01B 7/08; H02J 3/26
See application file for complete search history.

(56) References Cited

U.S. PATENT DOCUMENTS

| | | | |
|---|---|---|---|
| 5,557,249 A | * | 9/1996 | Reynal .................... H01F 30/12 336/10 |
| 5,565,753 A | | 10/1996 | Chen et al. |
| 5,588,818 A | | 12/1996 | Houmand et al. |
| 6,047,460 A | | 4/2000 | Nagate et al. |
| 6,177,803 B1 | | 1/2001 | Train et al. |
| 6,566,769 B1 | | 5/2003 | Layton |
| 7,971,650 B2 | | 7/2011 | Yuratich et al. |

(Continued)

FOREIGN PATENT DOCUMENTS

| | | |
|---|---|---|
| CN | 201374627 Y | 12/2009 |
| WO | 2015096547 A1 | 7/2015 |

OTHER PUBLICATIONS

Dudley L. Galloway, Dan Mulkey, Alan L. Wilks. May 16, 2012, Distribution Transformers from: Electric Power Transformer Engineering CRC Press (Year: 2012).*

(Continued)

*Primary Examiner* — Dean O Takaoka
*Assistant Examiner* — Alan Wong
(74) *Attorney, Agent, or Firm* — Gregory L. Porter; Hunton Andrews Kurth LLP

(57) ABSTRACT

Systems and methods may include balancing an unbalanced power cable using a transformer that has one or more phases by selecting a voltage on a tap handle; disposing a first bushing on one or more phases at a different voltage than the selected voltage; and balancing the unbalanced power cable based on the disposition of the first bushing on the one or more phases at the different voltage.

31 Claims, 5 Drawing Sheets

(56) References Cited

U.S. PATENT DOCUMENTS

| | | | | |
|---|---|---|---|---|
| 8,051,912 B2* | 11/2011 | Layton | ............... | E21B 17/028 |
| | | | | 166/369 |
| 9,190,846 B2* | 11/2015 | Eiland | ................. | H02J 3/26 |
| 2013/0272898 A1 | 10/2013 | Toh et al. | | |
| 2016/0041567 A1* | 2/2016 | Ko Thet | ................. | H02P 9/42 |
| | | | | 290/7 |
| 2016/0293294 A1* | 10/2016 | Matlack | ............. | F04D 13/0693 |

OTHER PUBLICATIONS

Int'l Search Report and Written Opinion (PCT/US2020/060250), dated Feb. 9, 2021.

* cited by examiner

SYSTEMS AND METHODS FOR BALANCING UNBALANCED POWER CABLES

FIELD OF THE DISCLOSURE

The present disclosure relates to systems and methods for balancing unbalanced power cables.

BACKGROUND

Three phase power transmission generally employs separate conductors for each phase. The conductors are within a three phase cable are generally in relatively close proximity, giving rise to inductive effects between each current carrying conductor and the remaining conductors. The instantaneous current in each of the three conductors varies with the current phase. At one instant, current is carried on one conductor and returned on a second while current within the third conductor is zero. At other times during the cycle, current is carried on one conductor and returned in equal parts on the other two conductors. The current changes result in corresponding changes in inductance between the conductors. For this reason, round cables, in which each conductor as seen from a cross-section is spaced an equal distance from the other two at the apex of an equilateral triangle, are generally preferred for three phase power transmission.

When drilling an oil well hole for oil field production, any increase in diameter of the wellbore may increase the cost of the well by thousands of dollars. Keeping the well bore relatively small to minimize cost has resulted in a change in the cable geometry used for a majority of the electrical submersible pump (ESP) industry. Historically, most cable consisted of round twisted insulated conductors and was therefore electrically balanced when transmitting power to the downhole motor. Now most cable is flat, which fits the well bore better, but creates an unbalanced impedance for electrical transmission. The cable is not designed to support its own weight requiring them to be clamped or banded to production tubing for support in the wellbore. With the advent of higher speed motors, these impedances are even more pronounced at, for example over 100 Hz and in some instances as much as 500-600 Hz or higher, rather than the standard $^{50}\!/_{60}$ Hz frequencies historically employed. It should be noted that the cable in many wells can be long and the differences in impedance in each leg may cause different voltage drops in each leg.

Prior references disclose creation of losses in the higher voltage phases or tried to compensate within the surface systems creating higher stress on components but suffer numerous deficiencies. For example, U.S. Pat. No. 6,566,769 discloses the addition of additional inductors which are expensive and do not have a method of adjusting for variations in the downhole cable. The following references are incorporated herein by reference in its entireties: SPE-194411-MS by David Shipp; WO2009151680A2; CA2412083A1; U.S. Pat. No. 6,566,769B1.

In many applications, drives are sized closely to the required power (kilo-volt ampere or KVA). That is, the drive output current capability is sized close to the current needed by the motor. Even if the drive can produce more current, exceeding the motor nameplate current is usually avoided by setting the current limit of the drive. In either case, when flat cable is utilized, one phase will reach the current limit before the other two, at which time the drive will cease to increase in frequency and the pump will operate at a lower RPM than desired. Accordingly, conductor inductance differences may result in significant voltage and current unbalances at the motor terminals and limit drive frequency. This imbalance is more pronounced in higher frequency motors and the longer the length of cable needed for deeper wells.

These and other deficiencies exist.

SUMMARY OF THE DISCLOSURE

Embodiments of the present disclosure provide a method of balancing an unbalanced power cable using a transformer that has one or more phases. The method may include selecting a voltage on a tap handle. The method may include disposing a first bushing on one or more phases at a different voltage than the selected voltage. The method may include balancing the unbalanced power cable based on the disposition of the first bushing on the one or more phases at the different voltage.

Embodiments of the present disclosure provide a flat cable. The flat cable may include a plurality of conductors. At least one of the plurality of conductors may include an impedance value differing from impedance values of each of the remaining plurality of conductors. The cable may be converted from an unbalanced mode to a balanced mode by disposing a bushing on one or two or all three phases at a voltage for one or more electrical submersible pump applications downhole.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Various embodiments of the present disclosure, together with further objects and advantages, may best be understood by reference to the following description taken in conjunction with the accompanying drawings.

DETAILED DESCRIPTION

Figure 1:
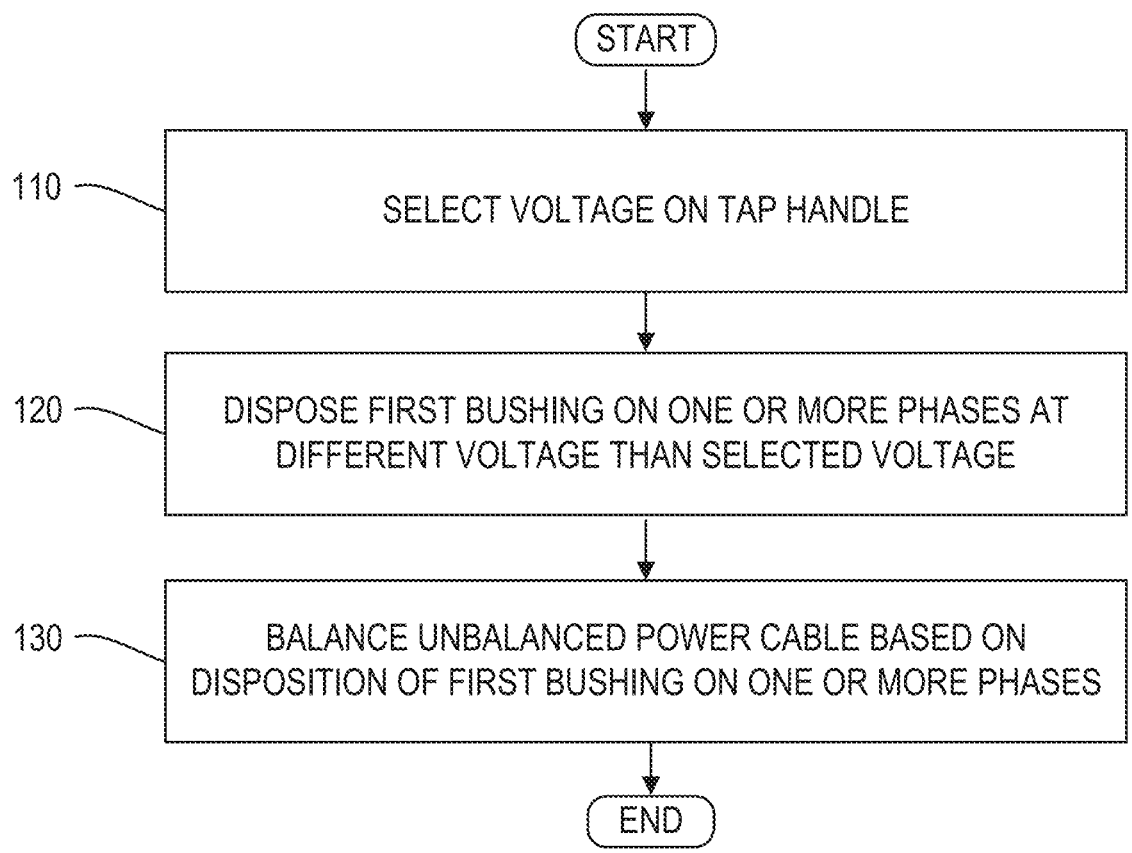
FIG. 1 depicts a method of balancing an unbalanced power cable according to an exemplary embodiment.

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

The systems and methods disclosed herein provide a method of taking appropriate corrective actions to the above-identified imbalance by creating a balance with the correct voltage from the step-up transformer already in the system, creating the balance of voltage and current needed by the motor connected via flat cable. The transformers utilized by the electrical submersible pump industry between the drive/switchboard and well may include step up type transformers and include adjustable taps to compensate for the voltage loss in the cable when the motor is running. The higher voltage is needed for transmitting adequate power to the downhole or surface electric motor utilizing a more cost effective (size) gauge of conductor based on the energy requirements. These taps are for all three phases and set the output voltage. The transforms may also be utilized by other industries with similar challenges, and as such are not limited to the ESP industry.

As discussed herein, the systems and methods provide numerous different implementations which allow one or more additional tap handles or one or more bushings to increase the voltage/decrease current on one or more phases relative to other phases. In some examples, this may be for two phases. For example, one or more bushings may be on one or more phases at a percentage greater or lesser than the selected voltage on the tap handle. This would result in advantageous costs and is inexpensive. The voltage difference may be fixed based on a specific bushing of attachment on the transformer for one phase only, or in other examples, for two phases only, or in other examples, for all three phases. One phase may be effective due to the geometry of a flat cable is such that only the center conductor includes a different impedance than the other two phases. This implementation may include additional turns on the transformer for that specific phase or the other two phases. The voltage difference may be created for flat cable compensation regardless of transformer model including step up or down, auto transformer, with or without phase shift, and E core or other lamination configurations.

For medium voltage drives, there is a phase shift input transformer (generally no step up transformer on the output) which may also have additional turns on one or more, e.g., a plurality of up to all phases to provide a balance for flat cables. Consequently, this implementation may create additional voltage on the modules within the drive associated with that phase.

In some examples, one or more additional tap handles, such as one or two or three additional tap handles may be configured to control selection of a percentage above the existing tap ratio to balance the voltage and current to the motor. In this manner, this implementation has the advantage that the operator may not know which is the center phase of the conductors.

FIG. 1 depicts a method 100 of balancing an unbalanced power cable using a transformer that has one or more phases according to an exemplary embodiment.

At step 110, the method 100 may include selecting a voltage on a tap handle. For example, a first voltage may be selected on the tap handle. The method 100 may further include selecting, via a second tap handle, one or more changes to a line-to-line voltage.

At step 120, the method 100 may include disposing a first bushing on the one or more phases at a different voltage than the selected voltage. For example, the first bushing may be disposed on one or more phases at a second voltage than the first voltage. Without limitation, the different voltage may be less than 10 kV. The different voltage may be fixed for the one or more phases based on an attachment of the first bushing to the transformer. In another example, the different voltage may be fixed for three phases based on an attachment of the first bushing to the transformer. The method 100 may include adding additional bushings to each phase. For example, two or more additional bushings may be added to each of the one or more phases. The method 100 may further include implementing one or more turns on the transformer to fix the different or second voltage for the one or more phases. In some examples, the different voltage may differ from (higher or lower) the selected voltage by a predetermined percentage. For example, the predetermined percentage may comprise a percent range between from about 1% up to about 40%, such as 5% or 10%, or 15%, or 20% or any other desired percentage differential.

At step 130, the method 100 may include balancing the unbalanced power cable based on the disposition of the first bushing on the one or more phases at the different voltage, such as the second voltage. In some examples, the power cable may be balanced on the disposition of the first bushing on the one or more phases at a voltage that is higher or lower than the selected voltage. The method 100 may further include adjusting the voltage by implementing one or more turns on a phase-shifting transformer.

Method 100 may further comprise transmitting, based on the different voltage, power to an electrical load. Without limitation, the electrical load may comprise a permanent magnet, an induction motor, a servomotor, or a switch reluctance motor. In some examples, the method 100 may include balancing voltage and current to the electrical load through one or more additional tap handles so as to allow selection of a value exceeding a tap ratio.

The transformer may comprise a plurality of phases. The transformer may comprise a step-up transformer. In other examples, the transformer may comprise a step-down transformer. The transformer may include a plurality of cores. For example, the transformer may include an E-lamination. The transformer may include an I-lamination. The transformer may include a U-I lamination. The transformer may include primary and secondary windings configured in a plurality of configurations. For example, at least one of the configurations may comprise a wye configuration. In another example, at least one of the configurations may comprise a delta configuration. In another example, at least one of the configurations may comprise a mixed wye-delta configuration. In some examples, the method 100 may include adding impedance by utilizing a magnetic core of the transformer.

Figure 2:
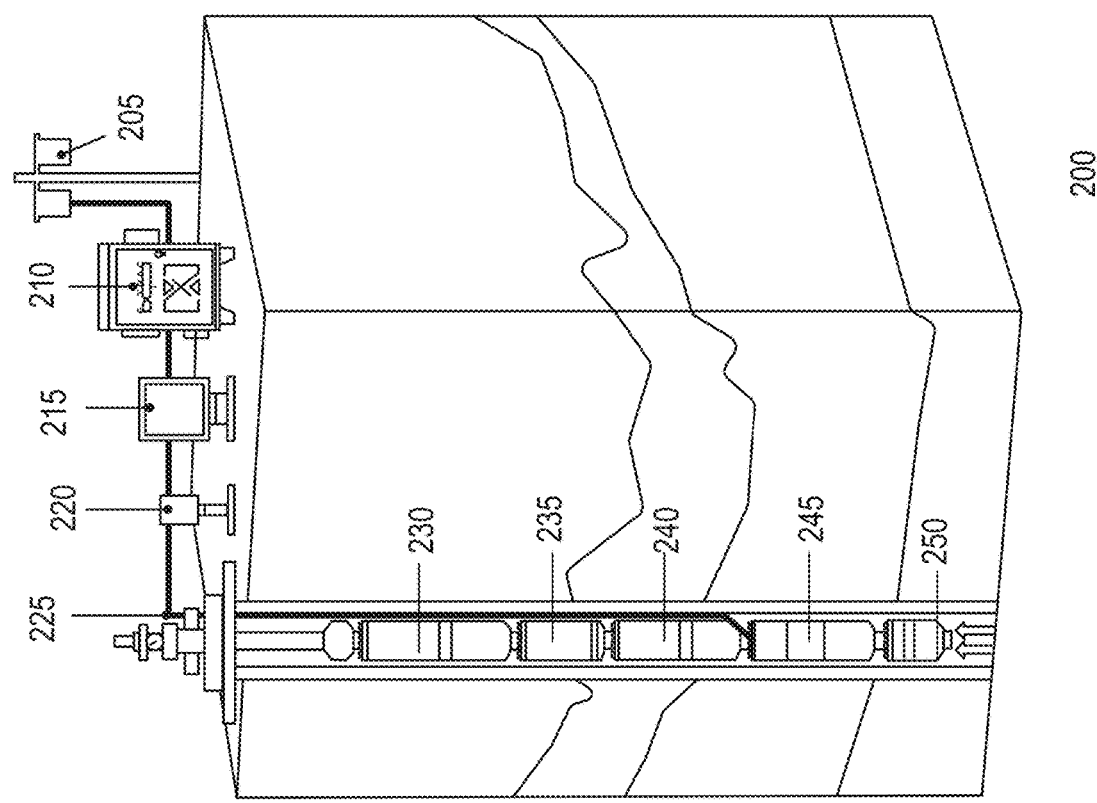
FIG. 2 illustrates an electrical submersible pump system according to an exemplary embodiment.

FIG. 2 illustrates an electrical submersible pump system (ESP) 200 according to an exemplary embodiment. As depicted, system 200 may include a first transformer 205, control module 210, a second transformer 215, a junction box 220, a cable 225, a pump 230, gas handling 235, seal 240, a motor 245, and a sensor 250. The system 200 may be configured for utilization in a well. For example, the ESP system 200 may be utilized for producing hydrocarbon and other liquids and gases from within a well bore to the earth surface. The ESP system 20 may include the pump 230, seal 240, and motor 245 located in the well bore, powered by surface power systems which may be a low voltage drive and step up transformer 215 or a switchboard motor protector. Although FIG. 2 illustrates single instances of components of system 200, system 200 may include any number of components. FIG. 2 may reference and incorporate any and all steps and components of method 100 in FIG. 1.

The transformer 215 may comprise a plurality of phases. The transformer 215 may comprise a step-up transformer. In other examples, the transformer 215 may comprise a step-down transformer. The transformer 215 may include a plurality of cores. For example, the transformer 215 may include an E-lamination. The transformer 215 may include an I-lamination. The transformer 215 may include a U-I lamination. The transformer 215 may include primary and secondary windings configured in a plurality of configurations. For example, at least one of the configurations may comprise a wye configuration. In another example, at least one of the configurations may comprise a delta configuration. In another example, at least one of the configurations may comprise a mixed wye-delta configuration. In some examples, a magnetic core of the transformer 215 may be utilized to add impedance on one, two, or three phases.

Cable 225 may reference cable 500, as further explained below with respect to FIG. 5.

ESP system 200 may run unbalanced due to the flat cable requirement geometry constraint which provides for shorter life of the equipment, increased power cost, reduced efficiency and mismatches in sizing. When a flat cable is utilized to transmit power to a three-phase motor, the differing conductor inductances may cause small changes in the voltage amplitude and phase at the motor terminals. The small differences in voltages may cause relatively large differences in phase currents, with those unbalances causing additional voltage drops and worsening the unbalance until an equilibrium is reached. The use of long lengths of flat cable to transmit power to a three-phase motor may result in current unbalance on the order of 10 to 15 percent. As discussed above, if three conductors are balanced such as a 3-phase 60 Hz or other frequency circuit, with distances to center line are equal in magnitude, then the voltages induced will be equal in magnitude but 120 degrees out of phase. Thus, the vector sum of all voltages induced in the wire is zero.

Figure 3A:
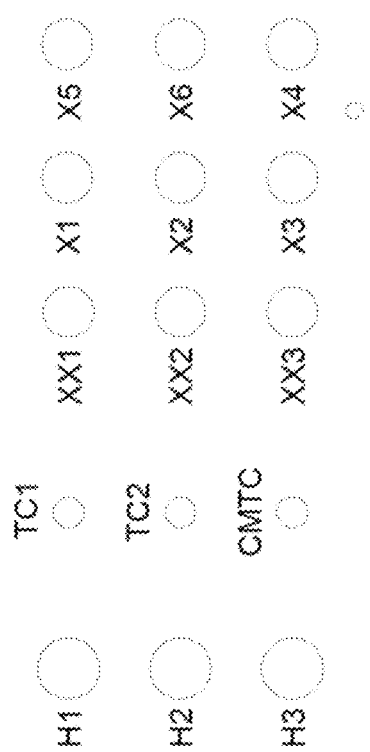
FIG. 3A illustrates a set of bushings according to an exemplary embodiment.
Figure 3B:
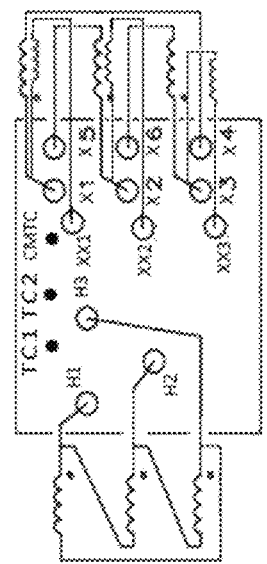
FIG. 3B illustrates a transformer according to an exemplary embodiment.

As illustrated in FIGS. 3A and 3B, an exemplary auxiliary set of bushings 300 and transformer 350 illustrating tap configuration is provided according to an exemplary embodiment. Although FIGS. 3A and 3B illustrate single instances of bushings 300, any number of bushings may be included. FIGS. 3A and 3B may reference and incorporate any and all steps and components of method 100 in FIG. 1, and system 200 in FIG. 2.

These bushings may comprise high voltage (HV) bushings. High voltage leads may be denoted by H, such as H1, H2, H3. The HV bushings are denoted XX, and are relative to the normal X-side line leads, such as XX1, XX2, XX3. In some examples, one or more additional bushings may be added to each phase and an additional one tap handle, such as a Common Mode Tap Changer (CMTC). The new tap handle may be configured to elect changes to the line to line voltage. The CMTC may be configured to change the line to line voltage of the XX outputs. The X outputs represent the outputs for the line leads, whose line-line voltage may be controlled by TC1, TC2. The wye configuration may be formed by tying X4, X5, and X6 together, for example, and may be done internally and brought out to a single X0 bushing to save cabinet space for a permanent wye HV configuration). Whichever phase that is designated as the common mode compensating phase may then be moved from that X1, X2 or X3 bushing over to the XX1, XX2 or XX3 bushing.

Figure 4:
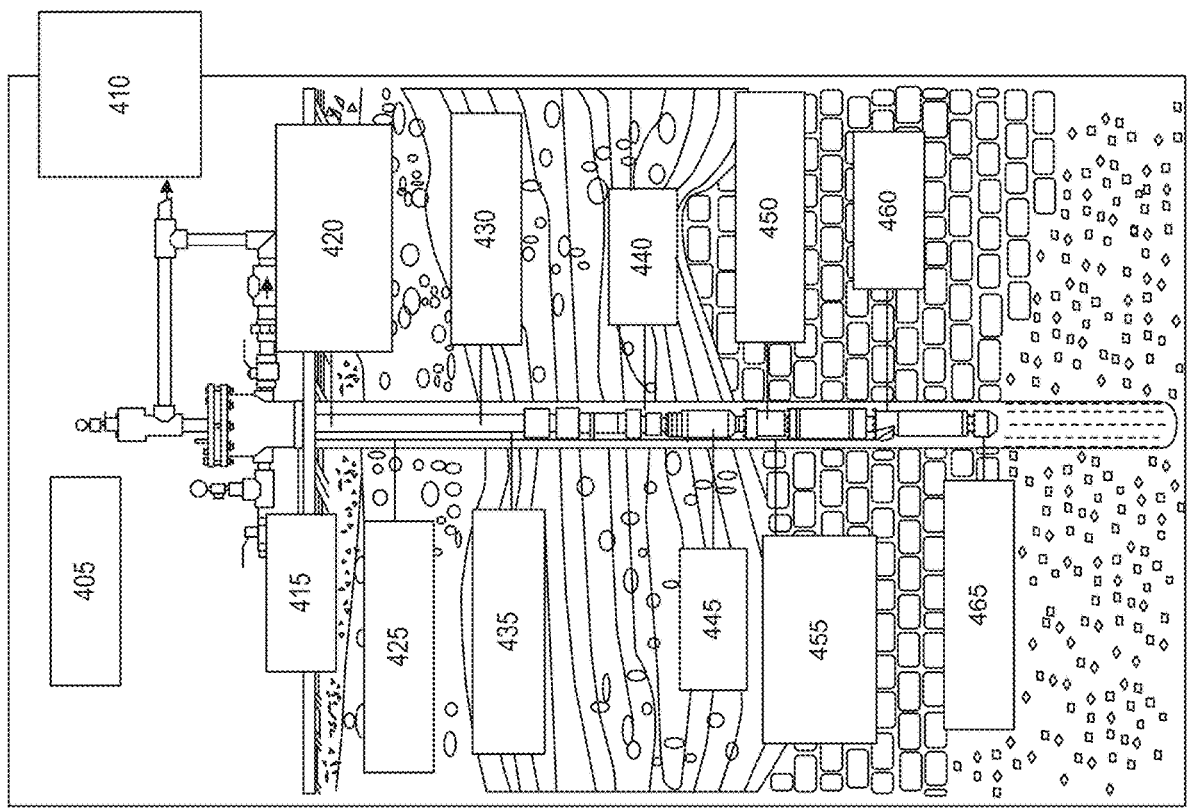
FIG. 4 illustrates a subsurface wellbore system according to an exemplary embodiment.

FIG. 4 illustrates a schematic of subsurface wellbore system 400 according to an exemplary embodiment. The system 400 may include a well head 405, output 410 to a battery, such as a central battery, casing 415, production tubing 420, power cable 425, drain valve 430, check valve 435, pump 440, intake 445, seal section 450, motor flat cable 455, sensor 460, and perforations 465. FIG. 4 may reference the same or similar components of method 100, system 200, and bushings and transformer of FIGS. 3A and 3B. Although FIG. 4 illustrates single instances of components of system 400, system 400 may include any number of components. FIG. 2 may reference and incorporate any and all steps and components of method 100 in FIG. 1, system 200 of FIG. 2, bushings and transformer of FIGS. 3A and 3B, and cable 500 of FIG. 5.

Figure 5:
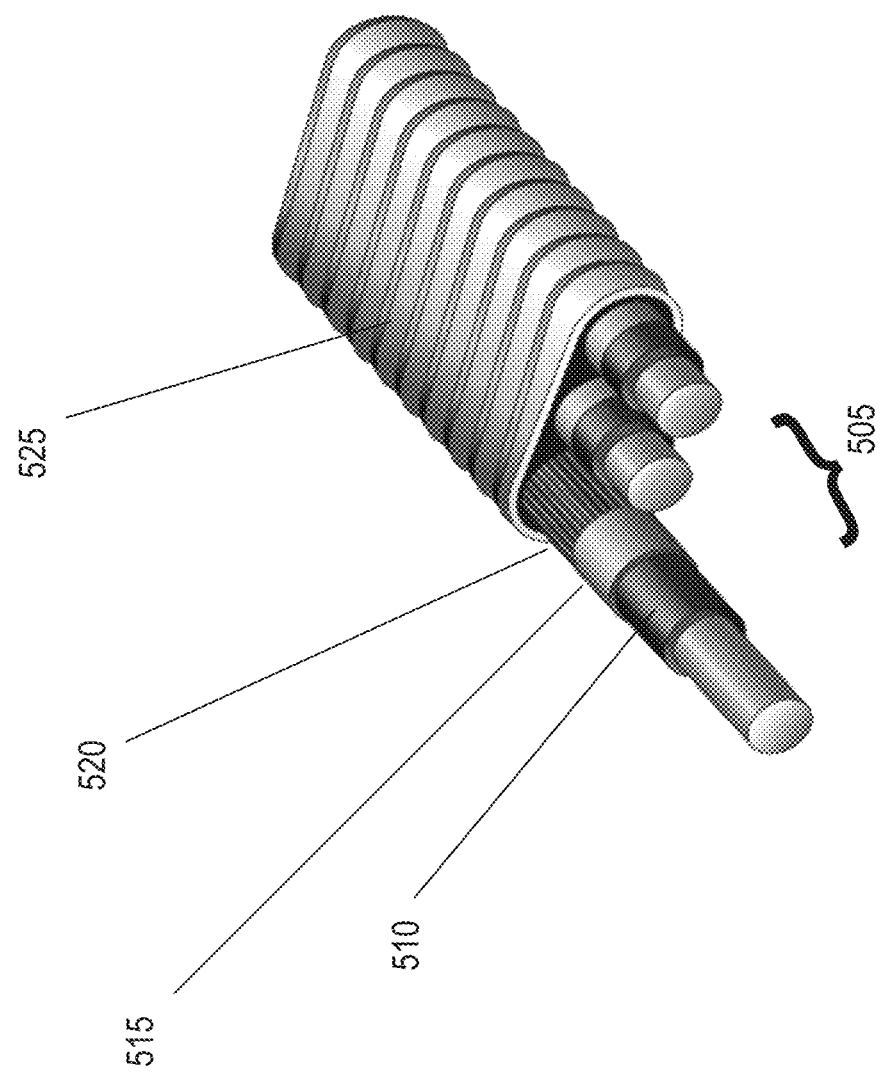
FIG. 5 illustrates a flat cable according to an exemplary embodiment.

FIG. 5 depicts a schematic of a cable 500 according to an exemplary embodiment. FIG. 5 may reference and incorporate any and all steps and components of method 100 in FIG. 1, system 200 in FIG. 2, bushings and transformer in FIGS. 3A and 3B, and system 400 in FIG. 4.

Cable 500 may include an electrical submersible pump cable. Cable 500 may comprise a plurality of conductors 505. Cable 500 may comprise an insulation 510. Cable 500 may comprise a barrier 515. Cable 500 may comprise bedding tape 520. Cable 500 may comprise an armor 525. For example, cable 500 may include Type HTF3 Flat Electrical Submersible Pump Cable by Kerite®.

The cable 500 may comprise a flat power cable. The cable 500 may further include a plurality of conductors 505. In some examples, one or more conductors selected from the plurality of conductors 505 may comprise an impedance value different from the remaining conductors 505 of the cable. For example, one of the conductors may include a different impedance value than each of two remaining conductors 505 of the cable 500. The plurality of conductors 505 may be sequentially arranged on a horizontal axis. Further, the cable 500 may be balanced and configured for one or more electrical submersible pump applications downhole. The cable 500 may be injected into a length of coiled tubing. As explained above, the cable 500 may be converted from an unbalanced mode to a balanced mode by disposing a bushing on one or two of three phases at a voltage for one or more electrical submersible pump applications downhole. The cable 500 may include one or more additional bushings disposed at each of the second and third phases. In some examples, the voltage may exceed a value than that selected by a tap handle. As previously explained, the cable 500 may be configured to transmit power to an electrical load.

The cable 500 may include a variety of dimensions. Without limitation, a length of the cable 500 may exceed 12,000 feet. In another example, a length of the cable 500 may comprise about 15,000 feet. The width of the cable 500 may include a range of about 1 inch to 2 inches, such as 1.5 inches. The thickness of the cable 500 may include a range of about 0.1 inches to about 1 inches, such as 0.5 inches.

The cable 500 may be a #2, #4, or #6 AWG conductor, insulated with polypropylene or ethylene propylene diene monomer (EPDM), and covered with nitrile or lead jacket (for downhole protection) and covered or wrapped with a galvanized steel, stainless steel or Monel® armor. For example, a #4 AWG EPDM/Lead Flat 5 KV cable may include a DC resistance of 0.258 ohms per thousand feet with and XL of 0.042 uh/1000 feet and Xc of 0.0648 uf/1000 feet. These impedances may increase with the length of the cable 500 as per the depth of well.

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

We claim:

1. A method of balancing an unbalanced power cable using a transformer that has one or more phases, comprising:
    selecting a voltage on a tap handle;
    disposing a first bushing on one or more phases at a different voltage than the selected voltage; and
    balancing the unbalanced power cable based on the disposition of the first bushing on the one or more phases at the different voltage.

2. The method of claim 1, further comprising transmitting, based on the different voltage, power to an electrical load.

3. The method of claim 2, wherein the electrical load comprises a permanent magnet, induction motor, a servomotor, or a switch reluctance motor.

4. The method of claim 1, wherein the different voltage is different from the selected voltage by a predetermined percentage.

5. The method of claim 1, wherein the power cable is balanced based on the disposition of the first bushing on the one or more phases at a voltage higher or lower than the selected voltage.

6. The method of claim 1, wherein the different voltage is less than 10 kV.

7. The method of claim 1, wherein the different voltage is fixed for the one or more phases based on an attachment of the first bushing to a transformer.

8. The method of claim 1, wherein the different voltage is fixed for three phases based on an attachment of the first bushing to a transformer.

9. The method of claim 1, further comprising implementing one or more turns on a transformer to fix the different voltage for the one or more phases.

10. The method of claim 7, wherein the transformer comprises a step up transformer or a step-down transformer.

11. The method of claim 7, wherein the transformer comprises one or more cores including an E lamination, I lamination, or a U-I lamination.

12. The method of claim 7, wherein the transformer comprises primary and secondary windings configured in a plurality of configurations.

13. The method of claim 12, wherein the plurality of configurations comprises a wye configuration, a delta configuration, or a mixed wye-delta configuration.

14. The method of claim 1, wherein one of a plurality of conductors of the power cable comprises an impedance value differing from impedance values of each of the remaining plurality of conductors.

15. The method of claim 1, further comprising adjusting the voltage by implementing one or more turns on a phase-shifting transformer.

16. The method of claim 1, further comprising adding impedance by utilizing a magnetic core of a transformer.

17. The method of claim 1, further comprising balancing voltage and current to an electrical load through one or more additional tap handles so as to allow a selection of a value exceeding a tap ratio.

18. The method of claim 1, further comprising selecting, via a second tap handle, one or more changes to line-to-line voltage.

19. The method of claim 1, further comprising adding two or more additional bushings to each of the one or more phases.

20. The method of claim 1, wherein the power cable comprises a flat power cable.

21. The method of claim 1, wherein the power cable is balanced for one or more electrical submersible pump applications downhole.

22. A flat cable, comprising:
    a plurality of conductors, wherein at least one of the plurality of conductors comprises an impedance value differing from impedance values of each of the remaining plurality of conductors, wherein the cable is converted from an unbalanced mode to a balanced mode by disposing a bushing on one or more of three phases at a voltage for one or more electrical submersible pump applications downhole.

23. The flat cable of claim 22, wherein a length of the cable exceeds 12,000 feet.

24. The flat cable of claim 22, wherein a length of the cable is about 15,000 feet.

25. The flat cable of claim 22, further comprising one or more additional bushings disposed at each of second and third phases.

26. The flat cable of claim 22, wherein the voltage exceeds a value than that selected by a tap handle.

27. The flat cable of claim 22, wherein the cable is configured to transmit power to an electrical load.

28. The flat cable of claim 27, wherein the electrical load comprises a permanent magnet, induction motor, a servomotor, or a switch reluctance motor.

29. The flat cable of claim 22, wherein the plurality of conductors are sequentially arranged on a horizontal axis.

30. The flat cable of claim 22, wherein the cable comprises a width of about 1.5 inches and a thickness of about 0.5 inches.

31. The flat cable of claim 22, wherein the cable is injected into a length of coiled tubing.

* * * * *